(12) United States Patent
Uzoh et al.

(10) Patent No.: US 11,652,083 B2
(45) Date of Patent: May 16, 2023

(54) PROCESSED STACKED DIES

(71) Applicant: ADEIA SEMICONDUCTOR BONDING TECHNOLOGIES INC., San Jose, CA (US)

(72) Inventors: Cyprian Emeka Uzoh, San Jose, CA (US); Guilian Gao, San Jose, CA (US); Laura Wills Mirkarimi, Sunol, CA (US); Gaius Gillman Fountain, Jr., Youngsville, NC (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 17/124,306

(22) Filed: Dec. 16, 2020

(65) Prior Publication Data
US 2021/0104487 A1    Apr. 8, 2021

Related U.S. Application Data

(62) Division of application No. 15/960,179, filed on Apr. 23, 2018, now Pat. No. 10,879,212.
(Continued)

(51) Int. Cl.
*H01L 23/00* (2006.01)
*H01L 21/308* (2006.01)
(Continued)

(52) U.S. Cl.
CPC ........ *H01L 24/83* (2013.01); *H01L 21/02076* (2013.01); *H01L 21/3085* (2013.01);
(Continued)

(58) Field of Classification Search
CPC .................................................. H01L 21/02076
See application file for complete search history.

(56) References Cited

U.S. PATENT DOCUMENTS

| 4,998,665 A | 3/1991 | Hayashi |
| 5,019,673 A | 5/1991 | Juskey et al. |

(Continued)

FOREIGN PATENT DOCUMENTS

| CN | 103681646 | 3/2014 |
| CN | 107527885 | 12/2017 |

(Continued)

OTHER PUBLICATIONS

European Patent Office, Supplementary European Search Report, dated Apr. 28, 2021, 11 pgs.
(Continued)

*Primary Examiner* — Mounir S Amer
(74) *Attorney, Agent, or Firm* — Knobbe, Martens, Olson & Bear, LLP

(57) ABSTRACT

Representative implementations of techniques and methods include processing singulated dies in preparation for bonding. A plurality of semiconductor die components may be singulated from a wafer component, the semiconductor die components each having a substantially planar surface. Particles and shards of material may be removed from edges of the plurality of semiconductor die component. Additionally, one or more of the plurality of semiconductor die components may be bonded to a prepared bonding surface, via the substantially planar surface.

29 Claims, 6 Drawing Sheets

Related U.S. Application Data

(60) Provisional application No. 62/504,834, filed on May 11, 2017.

(51) Int. Cl.
*H01L 21/311* (2006.01)
*H01L 21/683* (2006.01)
*H01L 21/78* (2006.01)
*H01L 23/31* (2006.01)
*H01L 25/065* (2006.01)
*H01L 25/00* (2006.01)
*H01L 21/02* (2006.01)
*H01L 21/3065* (2006.01)

(52) U.S. Cl.
CPC .... *H01L 21/31116* (2013.01); *H01L 21/6835* (2013.01); *H01L 21/6836* (2013.01); *H01L 21/78* (2013.01); *H01L 23/3185* (2013.01); *H01L 25/0657* (2013.01); *H01L 25/50* (2013.01); *H01L 21/3065* (2013.01); *H01L 2221/68327* (2013.01); *H01L 2221/68354* (2013.01); *H01L 2221/68368* (2013.01); *H01L 2224/83013* (2013.01); *H01L 2224/83031* (2013.01); *H01L 2224/83895* (2013.01); *H01L 2224/83896* (2013.01)

(56) References Cited

U.S. PATENT DOCUMENTS

| | | | |
|---|---|---|---|
| 5,087,585 A | 2/1992 | Hayashi |
| 5,322,593 A | 6/1994 | Hasegawa et al. |
| 5,753,536 A | 5/1998 | Sugiyama et al. |
| 5,771,555 A | 6/1998 | Eda et al. |
| 5,956,605 A | 9/1999 | Akram et al. |
| 5,985,739 A | 11/1999 | Plettner et al. |
| 5,998,808 A | 12/1999 | Matsushita |
| 6,008,126 A | 12/1999 | Leedy |
| 6,080,640 A | 6/2000 | Gardner et al. |
| 6,121,688 A | 9/2000 | Akagawa |
| 6,265,775 B1 | 7/2001 | Seyyedy |
| 6,374,770 B1 | 4/2002 | Lee |
| 6,423,640 B1 | 7/2002 | Lee et al. |
| 6,465,892 B1 | 10/2002 | Suga |
| 6,582,991 B1 | 6/2003 | Maeda et al. |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,126,212 B2 | 10/2006 | Enquist et al. |
| 7,193,423 B1 | 3/2007 | Dalton et al. |
| 7,262,492 B2 | 8/2007 | Pieda et al. |
| 7,354,798 B2 | 4/2008 | Pogge et al. |
| 7,750,488 B2 | 7/2010 | Patti et al. |
| 7,781,309 B2 | 8/2010 | Morita et al. |
| 7,790,578 B2 | 9/2010 | Furui |
| 7,803,693 B2 | 9/2010 | Trezza |
| 7,843,052 B1 | 11/2010 | Yoo et al. |
| 7,932,616 B2 | 4/2011 | Meguro |
| 8,026,181 B2 | 9/2011 | Arita et al. |
| 8,178,963 B2 | 5/2012 | Yang |
| 8,178,964 B2 | 5/2012 | Yang |
| 8,183,127 B2 | 5/2012 | Patti et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,513,088 B2 | 8/2013 | Yoshimura et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,988,299 B2 | 3/2015 | Kam et al. |
| 9,059,010 B2 | 6/2015 | Yoshida et al. |
| 9,076,929 B2 | 7/2015 | Katsuno et al. |
| 9,093,350 B2 | 7/2015 | Endo et al. |
| 9,142,517 B2 | 9/2015 | Liu |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,343,433 B2 | 5/2016 | Lee et al. |
| 9,355,997 B2 | 5/2016 | Katkar et al. |
| 9,368,866 B2 | 6/2016 | Yu |
| 9,385,024 B2 | 7/2016 | Tong et al. |
| 9,394,161 B2 | 7/2016 | Cheng et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,466,586 B1 | 10/2016 | Choi et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,570,421 B2 | 2/2017 | Wu et al. |
| 9,620,481 B2 | 4/2017 | Edelstein et al. |
| 9,656,852 B2 | 5/2017 | Cheng et al. |
| 9,674,939 B2 | 6/2017 | Scannell |
| 9,722,098 B1 | 8/2017 | Chung et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,818,729 B1 | 11/2017 | Chiu et al. |
| 9,852,988 B2 | 12/2017 | Enquist et al. |
| 9,865,567 B1 | 1/2018 | Chaware et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,960,142 B2 | 5/2018 | Chen et al. |
| 10,008,844 B2 | 6/2018 | Wang et al. |
| 10,026,605 B2 | 7/2018 | Doub et al. |
| 9,953,941 B2 | 8/2018 | Enquist |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,333,623 B1 | 6/2019 | Liao et al. |
| 10,410,976 B2 | 9/2019 | Asano et al. |
| 10,418,277 B2 | 9/2019 | Cheng et al. |
| 10,446,456 B2 | 10/2019 | Shen et al. |
| 10,510,629 B2 | 12/2019 | Chen et al. |
| 10,707,087 B2 | 7/2020 | Uzoh et al. |
| 10,707,145 B2 | 7/2020 | Bultitude et al. |
| 10,727,204 B2 | 7/2020 | Agarwal et al. |
| 10,727,219 B2 | 7/2020 | Uzoh et al. |
| 10,770,430 B1 | 9/2020 | Kim et al. |
| 10,790,262 B2 | 9/2020 | Uzoh et al. |
| 10,840,135 B2 | 11/2020 | Uzoh |
| 10,854,578 B2 | 12/2020 | Morein |
| 10,879,212 B2 | 12/2020 | Uzoh et al. |
| 10,879,226 B2 | 12/2020 | Uzoh et al. |
| 10,886,177 B2 | 1/2021 | DeLaCruz et al. |
| 10,892,246 B2 | 1/2021 | Uzoh |
| 10,923,413 B2 | 2/2021 | DeLaCruz |

(56) References Cited

U.S. PATENT DOCUMENTS

| | | |
|---|---|---|
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,011,503 B2 | 5/2021 | Wang et al. |
| 11,031,285 B2 | 6/2021 | Katkar et al. |
| 11,056,348 B2 | 7/2021 | Theil |
| 11,056,390 B2 | 7/2021 | Uzoh et al. |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 2002/0000328 A1 | 1/2002 | Motomura et al. |
| 2002/0003307 A1 | 1/2002 | Suga |
| 2002/0004288 A1 | 1/2002 | Nishiyama |
| 2004/0084414 A1 | 5/2004 | Sakai et al. |
| 2004/0140546 A1 | 7/2004 | Lee et al. |
| 2004/0188501 A1 | 9/2004 | Tolchinsky et al. |
| 2004/0238927 A1 | 12/2004 | Miyazawa |
| 2005/0040530 A1 | 2/2005 | Shi |
| 2005/0153522 A1 | 7/2005 | Hwang et al. |
| 2005/0161808 A1* | 7/2005 | Anderson .......... H01L 21/76256 257/730 |
| 2006/0057945 A1 | 3/2006 | Hsu et al. |
| 2006/0234473 A1 | 10/2006 | Wong et al. |
| 2007/0007639 A1 | 1/2007 | Fukazawa et al. |
| 2007/0096294 A1 | 5/2007 | Ikeda et al. |
| 2007/0111386 A1 | 5/2007 | Kim et al. |
| 2007/0123061 A1 | 5/2007 | Evertsen et al. |
| 2007/0158024 A1 | 7/2007 | Addison et al. |
| 2007/0222048 A1 | 9/2007 | Huang |
| 2007/0295456 A1 | 12/2007 | Gudeman et al. |
| 2008/0036082 A1 | 2/2008 | Eun |
| 2008/0165521 A1 | 7/2008 | Bernstein et al. |
| 2008/0265421 A1 | 10/2008 | Brunnbauer et al. |
| 2009/0029274 A1 | 1/2009 | Olson et al. |
| 2009/0068831 A1 | 3/2009 | Enquist et al. |
| 2009/0095399 A1* | 4/2009 | Zussy ............... H01L 21/76254 156/60 |
| 2009/0149023 A1 | 6/2009 | Koyanagi |
| 2009/0227089 A1 | 9/2009 | Plaut et al. |
| 2009/0252939 A1 | 10/2009 | Park et al. |
| 2009/0283898 A1 | 11/2009 | Janzen et al. |
| 2010/0123268 A1 | 5/2010 | Menard |
| 2011/0042814 A1 | 2/2011 | Okuyama |
| 2011/0074033 A1 | 3/2011 | Kaltalioglu et al. |
| 2011/0186977 A1 | 8/2011 | Chi et al. |
| 2011/0290552 A1 | 12/2011 | Palmateer et al. |
| 2012/0025396 A1 | 2/2012 | Liao et al. |
| 2012/0049344 A1 | 3/2012 | Pagaila et al. |
| 2012/0077314 A1 | 3/2012 | Park et al. |
| 2012/0190187 A1 | 7/2012 | Yang et al. |
| 2012/0212384 A1 | 8/2012 | Kam et al. |
| 2012/0217644 A1 | 8/2012 | Pagaila |
| 2012/0238070 A1* | 9/2012 | Libbert ............. H01L 21/76251 438/455 |
| 2013/0037962 A1 | 2/2013 | Xue |
| 2013/0082399 A1 | 4/2013 | Kim et al. |
| 2013/0122655 A1 | 5/2013 | Yu et al. |
| 2013/0169355 A1 | 7/2013 | Chen et al. |
| 2013/0299997 A1 | 11/2013 | Sadaka |
| 2013/0334697 A1 | 12/2013 | Shin et al. |
| 2014/0013606 A1 | 1/2014 | Nah et al. |
| 2014/0154839 A1 | 6/2014 | Ahn et al. |
| 2014/0175655 A1 | 6/2014 | Chen et al. |
| 2014/0187040 A1 | 7/2014 | Enquist et al. |
| 2014/0225795 A1 | 8/2014 | Yu |
| 2014/0299981 A1 | 10/2014 | Goh et al. |
| 2014/0312511 A1 | 10/2014 | Nakamura |
| 2014/0327150 A1 | 11/2014 | Jung et al. |
| 2014/0370658 A1 | 12/2014 | Tong et al. |
| 2014/0377909 A1 | 12/2014 | Chung et al. |
| 2015/0021754 A1 | 1/2015 | Lin et al. |
| 2015/0048500 A1 | 2/2015 | Yu et al. |
| 2015/0064498 A1 | 3/2015 | Tong |
| 2015/0102468 A1 | 4/2015 | Kang et al. |
| 2015/0130082 A1 | 5/2015 | Lu et al. |
| 2015/0179481 A1 | 6/2015 | Lin |
| 2015/0206865 A1 | 7/2015 | Yu et al. |
| 2015/0235949 A1 | 8/2015 | Yu et al. |
| 2015/0270209 A1 | 9/2015 | Woychik et al. |
| 2015/0303174 A1 | 10/2015 | Yu et al. |
| 2015/0340285 A1 | 11/2015 | Enquest et al. |
| 2016/0035687 A1 | 2/2016 | Lin et al. |
| 2016/0071770 A1 | 3/2016 | Albermann et al. |
| 2016/0141267 A1 | 5/2016 | Hagimoto et al. |
| 2016/0190103 A1 | 6/2016 | Kabe et al. |
| 2016/0233175 A1 | 8/2016 | Dubey et al. |
| 2016/0300817 A1 | 10/2016 | Do et al. |
| 2016/0343682 A1 | 11/2016 | Kawasaki |
| 2016/0372323 A1 | 12/2016 | Doub et al. |
| 2017/0023405 A1 | 1/2017 | Fahim et al. |
| 2017/0062366 A1 | 3/2017 | Enquist |
| 2017/0148764 A1 | 5/2017 | Wang et al. |
| 2017/0179029 A1 | 6/2017 | Enquist et al. |
| 2017/0194271 A1 | 7/2017 | Hsu et al. |
| 2017/0200659 A1 | 7/2017 | Gaynes et al. |
| 2017/0200711 A1 | 7/2017 | Uzoh et al. |
| 2017/0200756 A1* | 7/2017 | Kao ................ H01L 27/14636 |
| 2017/0250161 A1 | 8/2017 | Haba |
| 2017/0338214 A1 | 11/2017 | Uzoh et al. |
| 2017/0358533 A1 | 12/2017 | Briggs et al. |
| 2017/0358553 A1 | 12/2017 | Kim et al. |
| 2017/0365591 A1 | 12/2017 | Chang et al. |
| 2018/0005992 A1 | 1/2018 | Yu et al. |
| 2018/0006006 A1 | 1/2018 | Kim et al. |
| 2018/0012787 A1 | 1/2018 | Oka et al. |
| 2018/0012863 A1 | 1/2018 | Yu et al. |
| 2018/0053746 A1 | 2/2018 | Yu et al. |
| 2018/0068958 A1 | 3/2018 | Cho et al. |
| 2018/0096931 A1 | 4/2018 | Huang et al. |
| 2018/0122774 A1 | 5/2018 | Huang et al. |
| 2018/0130769 A1 | 5/2018 | Tan et al. |
| 2018/0158749 A1 | 6/2018 | Yu et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0366442 A1 | 12/2018 | Gu et al. |
| 2018/0366446 A1 | 12/2018 | Haba et al. |
| 2019/0096741 A1 | 3/2019 | Uzoh et al. |
| 2019/0096842 A1 | 3/2019 | Fountain, Jr. et al. |
| 2019/0103409 A1 | 4/2019 | Xu et al. |
| 2019/0115272 A1 | 4/2019 | Yu et al. |
| 2019/0131277 A1 | 5/2019 | Yang et al. |
| 2019/0157333 A1 | 5/2019 | Tsai |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0319007 A1 | 10/2019 | Uzoh et al. |
| 2019/0333550 A1 | 10/2019 | Fisch |
| 2019/0333871 A1 | 10/2019 | Chen et al. |
| 2019/0341306 A1 | 11/2019 | Yu et al. |
| 2019/0348336 A1 | 11/2019 | Katkar et al. |
| 2019/0355706 A1 | 11/2019 | Enquist et al. |
| 2019/0371763 A1 | 12/2019 | Agarwal et al. |

(56) References Cited

U.S. PATENT DOCUMENTS

| | | |
|---|---|---|
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0106156 A1 | 4/2020 | Lu et al. |
| 2020/0118973 A1 | 4/2020 | Wang et al. |
| 2020/0126906 A1 | 4/2020 | Uzoh et al. |
| 2020/0176419 A1 | 6/2020 | Dabral et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0057309 A1 | 2/2021 | Hu et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0183847 A1 | 6/2021 | Uzoh et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0020729 A1 | 1/2022 | Gao et al. |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0189941 A1 | 6/2022 | Enquist et al. |
| 2022/0199560 A1 | 6/2022 | Haba et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0293567 A1 | 9/2022 | Uzoh et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |

FOREIGN PATENT DOCUMENTS

| | | |
|---|---|---|
| EP | 2 685 491 A2 | 1/2014 |
| JP | 04-337694 | 11/1992 |
| JP | 2000-100679 | 4/2000 |
| JP | 2001-102479 | 4/2001 |
| JP | 2002-353416 A | 12/2002 |
| JP | 2004-193493 | 7/2004 |
| JP | 2009-135348 | 6/2009 |
| JP | 2010-073964 | 4/2010 |
| JP | 2011-171614 | 9/2011 |
| JP | 2013-33786 A | 2/2013 |
| JP | 2018-160519 A | 10/2018 |
| KR | 10-2001-0104643 | 11/2001 |
| KR | 1020040020827 A | 3/2004 |
| KR | 10-2010-0123755 | 11/2010 |
| KR | 10-2015-0097798 | 8/2015 |
| WO | 2005-043584 A2 | 5/2005 |
| WO | 2015134227 A1 | 9/2005 |
| WO | WO 2006/100444 A1 | 9/2006 |
| WO | WO 2009/005898 A1 | 1/2009 |
| WO | WO 2010/024678 A1 | 3/2010 |
| WO | 2014052445 A1 | 4/2014 |
| WO | WO 2017/034654 A1 | 3/2017 |
| WO | WO 2017/052652 A1 | 3/2017 |
| WO | WO 2017/151442 A1 | 9/2017 |

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.
Moriceau, H. et al., "Overview of Recent Direct Wafer Bonding Advances and Applications", Advances in Natural Sciences—Nanoscience and Nanotechnology, 2010, 12 pages.
Nakanishi, H. et al., "Studies on SiO2—SiO2 Bonding with Hydrofluoric Acid. Room Temperature and Low Stress Bonding Technique for MEMS," Tech. Research Lab., 200, Elsevier Science S.A., 8 pages.
Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(l), 6 pages.
Plobi et al., "Wafer Direct Bonding: Tailoring Adhesion Between Biillle Materials," Materials Science and Engineering Review Journal, 1999, 88 pages.
International Search Report and Written Opinion, dated Aug. 8, 2018, for PCT Application No. PCT/US2018/029094, filed Apr. 24, 2018, 15 pages.
Suga et al., "Bump-less Interconnect for Next Generation System Packaging", IEEE, 2001 and ECTC, 2001, 6 pages.
Suga et al., "Feasibility of surface activated bonding for ultra-fine pitch interconnection-a new concept of bump-less direct bonding for system level packaging", IEEE, 2000, 1 page.
Amirfeiz et al., "Formation of silicon structures by plasma-activated wafer bonding," Journal of The Electrochemical Society, 2000, vol. 147, No. 7, pp. 2693-2698.
Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vols. 117-118, pp. 808-812.
Extended European Search Report dated Apr. 28, 2021, European Application No. 18799043.7, 11 pages.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Frumusanu, Andrei, "TSMC's version of EMIB is 'LSI': Currently in pre-qualification," AnaandTech, https://www.anandtech.com/show/16031/tsmcs-version-of-emib-lsi-3dfabric, Aug. 25, 2020, 6 pages.
Fukushima, T. et al., "New three-dimensional integration technology using self-assembly technique," International Electron Devices Meeting Dec. 5-7, 2005, IEEE, Dec. 5, 2005, pp. 348-351.
Gösele et al., "Semiconductor Wafer Bonding: A flexible approach to materials combinations in microelectronics; micromechanics and optoelectronics," IEEE, 1997, pp. 23-32.
Hooper, A. et al. "Review of wafer dicing techniques for via-middle process 3DI/TSV ultrathin silicon device wafers," 2015 IEEE 65th Electronic Components and Technology Conference (ECTC).
Hosoda et al., "Effect of the surface treatment on the room-temperature bonding of Al to Si and SiO2," Journal of Materials Science, Jan. 1, 1998, vol. 33, Issue 1, pp. 253-258.

(56) References Cited

OTHER PUBLICATIONS

Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.
Howlader et al., "A novel method for bonding of ionic wafers," Electronics Components and Technology Conference, 2006, IEEE, p. 7-pp.
Howlader et al., "Bonding of p. Si/n-InP wafers through surface activated bonding method at room temperature," Indium Phosphide and Related Materials, 2001, IEEE International Conference On, pp. 272-275.
Howlader et al., "Characterization of the bonding strength and interface current of p. Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Search Report and Written Opinion dated Sep. 22, 2017, issued in International Application No. PCT/US2017/029187, 20 pages.
International Search Report and Written Opinion dated Apr. 22, 2019 in International Application No. PCT/US2018/064982, 13 pages.
International Search Report and Written Opinion dated May 7, 2020, issued in International Application No. PCT/US2020/013377, 16 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu-CU, Cu—Si, and Cu—SiO2 at low temperature," Proceedings—Electrochemical Society, 2003, vol. 19, pp. 239-247.
Marinov, Val et al., "Laser-enabled advanced packaging of ultrathin bare dice in flexible substrates," IEEE Transactions on Components, Packaging and Manufacturing Technology, Apr. 2012, vol. 2, No. 4, pp. 569-577.
Matsuzawa et al., "Room-temperature interconnection of electroplated Au microbump by means of surface activated bonding method," Electornic Components and Technology Confererence, 2001, 51st Proceedings, IEEE, pp. 384-387.
Office Action for U.S. Appl. No. 15/159,649, dated Sep. 14, 2017, 9 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.

Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Supplemental European Search Report dated Jun. 19, 2019 in European Application No. 17799846.5, 16 pages.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

(56) References Cited

OTHER PUBLICATIONS

"The effects of edge trimming - Engineering R&D Division, Operation V," DISCO Technical Review Mar. 2016, 3 pages.

Tong et al., "Low temperature wafer direct bonding," Journal of Microelectomechanical systems, Mar. 1994, vol. 3, No. 1, pp. 29-35.

Topol et al., "Enabling technologies for wafer-level bonding of 3D MEMS and integrated circuit structures," 2004 Electronics Components and Technology Conference, 2004 IEEE, pp. 931-938.

Uhrmann, T. et al., "Heterogeneous integration by collective die-to-wafer bonding," Chip Scale Review, Nov./Dec. 2018, vol. 22, No. 6, pp. 10-12.

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method," Microelectronics Reliability, May 2003, vol. 43, Issue 5, pp. 751-756.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Xu et al., "New Au—Al interconnect technology and its reliability by surface activated bonding," Electronic Packaging Technology Proceedings, Oct. 28-30, 2003, Shanghai, China, pp. 479-483.

Ceramic Microstructures: Control at the Atomic Level, Recent Progress in Surface Activated Bonding, 1998, pp. 385-389.

Chang, T.C. et al., "A method for fabricating a superior oxide/nitride/oxide gate stack," Electrochemical and Solid-State Letters, 2004, vol. 7, No. 7, pp. G138-G140.

"Die-to-Wafer Fusion and Hybrid Bonding," EV Group, https://www.evgroup.com/technologies/die-to-wafer-fusion-and-hybrid-bonding/, printed Sep. 21, 2022, 8 pages.

Gao, G. et al., "Low temperature hybrid bonding for die to wafer stacking applications," 2021 IEEE 71st Electronic Components and Technology Conference (ECTC), IEEE, Jun. 1, 2021-Jul. 4, 2021.

Jin, H. et al., "Silicon / Silicon Oxide / LPCVD Silicon Nitride Stacks: The Effect of Oxide Thickness on Bulk Damage and Surface Passivation," Centre for Sustainable Energy Systems, Faculty of Engineering and Information Technology, The Australian National University, Canberra ACT 0200, Australia, 3 pages.

"Lecture 29: Productivity and process yield," National Programme on Technology Enhanced Learning (NPTEL), MM5017: Electronic materials, devices, and fabrication, 16 pages.

* cited by examiner

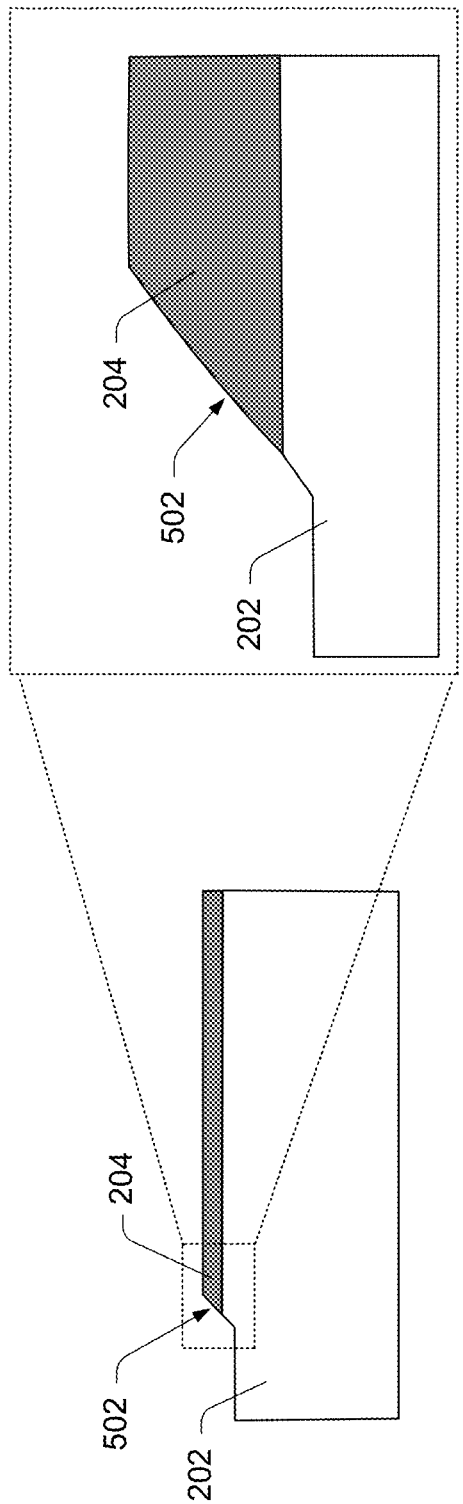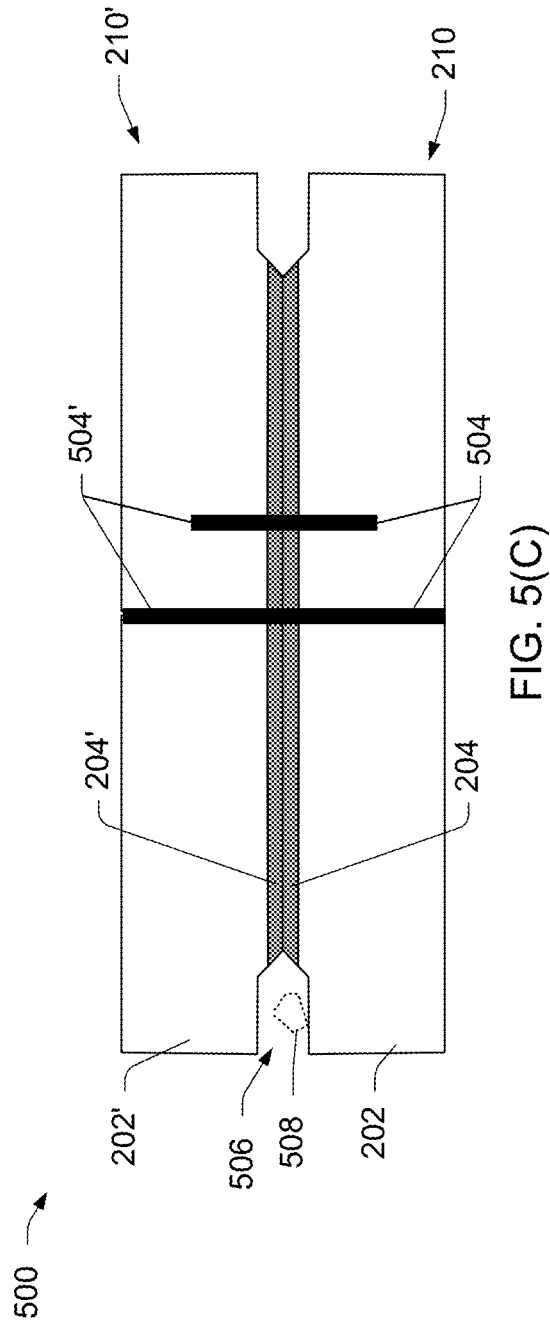

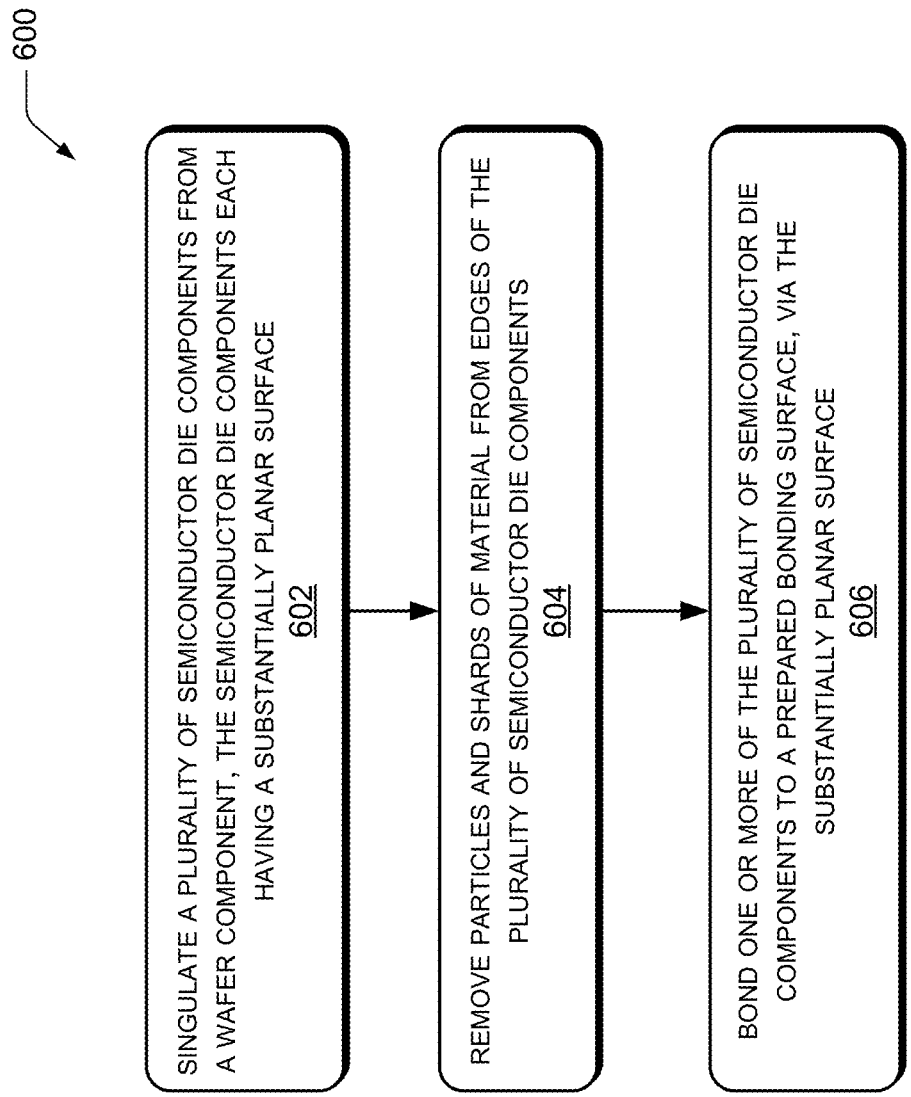

PROCESSED STACKED DIES

PRIORITY CLAIM AND CROSS-REFERENCE TO RELATED APPLICATION

This application is a divisional of U.S. patent application Ser. No. 15/960,179, filed Apr. 23, 2018, which claims the benefit under 35 U.S.C. § 119(e)(1) of U.S. Provisional Application No. 62/504,834, filed May 11, 2017, both of which are hereby incorporated by reference in their entirety.

FIELD

The following description relates to processing of integrated circuits ("ICs"). More particularly, the following description relates to techniques for processing singulated dies in preparation for bonding.

BACKGROUND

Dies may be stacked in a three-dimensional arrangement as part of various microelectronic packaging schemes. This can include stacking a layer of one or more dies on a larger base die, stacking multiple dies in a vertical arrangement, and various combinations of both. Dies may also be stacked on wafers or wafers may be stacked on other wafers prior to singulation. The dies or wafers may be bonded in a stacked arrangement using various bonding techniques, including using direct dielectric bonding, non-adhesive techniques, such as a ZiBond® direct bonding technique or a DBI® hybrid bonding technique, both available from Invensas Bonding Technologies, Inc. (formerly Ziptronix, Inc.), a subsidiary of Xperi Corp (see for example, U.S. Pat. Nos. 6,864,585 and 7,485,968, which are incorporated herein in their entirety).

When bonding stacked dies using a direct bonding technique, it is desirable that the surfaces of the dies to be bonded be extremely flat and smooth. For instance, the surfaces should have a very low variance in surface topology, such that the surfaces can be closely mated to form a lasting bond. It is also desirable that the surfaces be clean and free from impurities, particles, and/or other residue. The presence of undesirable particles for instance, can cause the bond to be defective or unreliable at the location of the particles. For instance, some particles and residues remaining on bonding surfaces can result in voids at the bonding interfaces between the stacked dies. If the voids are substantially smaller than the metallic electrical interconnect size, they may be acceptable. However, particles that cause bonding defects in sizes that are close to or exceed the electrical interconnect size often cannot be tolerated, since they can negatively impact the electrical conductivity of the interconnect.

Since semiconductor wafers (e.g., silicon wafers, for example) are brittle, it is common for defects or particles to be created at the edges of dies as they are singulated. As an example, silicon can crack during cutting, forming loose particles. Mechanical cutting or sawing often leaves a rough edge and can also leave particles or shards of silicon on or near the edges of cut dies. In addition, mechanical saw dicing typically transfers materials from the dicing sheet to the side wall and edge of the singulated dies. Laser cutting can also leave particles on the surface or edge of the dies. Various processes can be used to clean the surfaces of the dies after cutting. However, the processes can often leave some particles at the periphery of the die or at an edge wall of the die. Even when die surfaces are polished, shards may still be present on the edges or sidewalls of the dies. The loose particles and shards left behind can be problematic to forming reliable bonds. Additionally, these loose or partially loose particles may re-contaminate the bonding surfaces of interest or the bonding tool, etc. in subsequent operations.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

FIG. 5(A) is a profile view of a die with a recessed oxide region, according to an embodiment. FIG. 5(B) is a magnified view of the profile view of the die with a recessed oxide region. FIG. 5(C) is an example of a bonded die arrangement having a recessed oxide region.

FIG. 6 is a flow diagram illustrating example processes for processing stacked dies, according to an embodiment.

SUMMARY

Figure 1A:
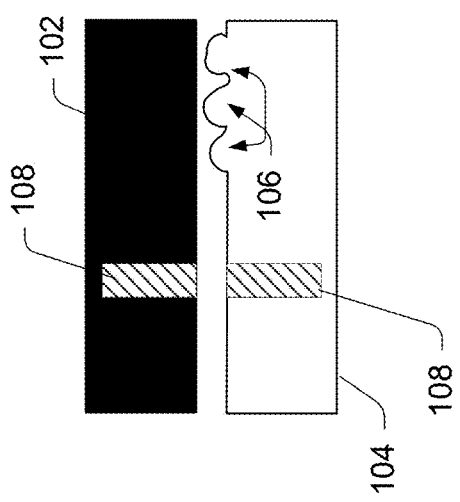
FIG. 1(A) is a profile view showing defects on a top surface of a die, according to an embodiment.

Various embodiments and techniques can be used to process singulated dies in preparation for bonding. The embodiments comprise techniques to remedy the accumulation of defects found on dies, and includes removing, dissolving or etching particles at the edges of dies to provide a smooth bonding surface. The dies may be comprised of a semiconductor or a non-semiconductor material. Semiconductor materials may, for example, comprise direct band gap or indirect band gap semiconductors and their combinations thereof. Non-semiconductor materials may comprise, for example, a dielectric material for example, glass, ceramic, glass ceramics, silicon carbide, silicon oxycarbides, silicon nitrides or silicon oxynitrides, diamond, silicon oxide, or the like, or combinations thereof.

A microelectronic system can include at least a first microelectronic component comprising a base semiconductor layer and a dielectric layer, the dielectric layer having a substantially planar surface. Additionally, a second microelectronic component may be directly bonded without adhesive to the dielectric layer of the first microelectronic component, the dielectric layer having an undercut at a periphery of the dielectric layer, such that an area of the dielectric layer is less than an area of a footprint of the first and/or second microelectronic components. Alternatively, the second microelectronic component may comprise at least a second base semiconductor layer and a second dielectric layer, the second dielectric layer having a substantially planar surface. Additionally, the second dielectric layer may be directly bonded without adhesive to the first dielectric layer, at the first and second substantially planar surfaces, the first base semiconductor layer and the second base semiconductor layer having an undercut at a periphery of the first and second base semiconductor layers, respectively, such that an area of a footprint of the first base semiconductor layer and an area of a footprint of the second base semiconductor layer is less than an area of the first and/or second dielectric layers.

In a first embodiment, an undercut at a periphery of the base semiconductor layer of the first microelectronic component and/or the second microelectronic component may correspond to an undercut at the periphery of the dielectric layer of the first microelectronic component and/or the second microelectronic component.

In a second embodiment, the second microelectronic component may include at least a base semiconductor layer and a dielectric layer with a substantially planar surface, the dielectric layer of the first microelectronic component being directly bonded to the dielectric layer of the second microelectronic component, and the dielectric layer of the second microelectronic component having an undercut at a periphery of the dielectric layer of the second microelectronic component, such that an area of the dielectric layer of the second microelectronic component is less than the area of the footprint of the first and/or second microelectronic components.

A method for forming a microelectronic system can include singulating a plurality of semiconductor die components from a wafer component, the semiconductor die components each having a substantially planar surface. Particles and shards of material may be removed from edges of the plurality of semiconductor die components. Additionally, one or more of the plurality of semiconductor die components may be bonded to a prepared bonding surface, via the substantially planar surface.

In a third embodiment, the particles and shards of material may be removed by etching the edges of the plurality of semiconductor die components. The edges of the plurality of semiconductor die components may be etched while the plurality of semiconductor die components are on a dicing carrier (such as a dicing sheet, dicing tape, etc.). Additionally, the edges of the plurality of semiconductor die components may be etched using a chemical etchant. In an implementation, the chemical etchant can comprise hydrofluoric acid and nitric acid with Benzotriazole (BTA) or other chemicals that inhibit Cu dissolution in the etchant. Further, the edges of the plurality of semiconductor die components may be etched using a plasma etch. Additionally, the edges of the plurality of semiconductor die components may be etched to reduce a thickness of the plurality of semiconductor die components such that a space is created at one or more of the edges of each of the plurality of semiconductor die components. The semiconductor die components may include an oxide layer as the substantially planar surface, and the etching may include removing at least a portion of the oxide layer at the edges of the plurality of semiconductor die components. Still yet, the substantially planar surface of the plurality of semiconductor die components may be etched. The substantially planar surface may be etched to a preselected depth or for a preselected duration.

In a fourth embodiment, a protective coating may be applied to the substantially planar surface of the plurality of semiconductor die components prior to etching to protect the substantially planar surface from the etchant.

In a fifth embodiment, the plurality of semiconductor die components may be heated after singulating to cause the protective coating to recede from a periphery of the plurality of semiconductor die components. Additionally, the periphery of the plurality of semiconductor die components may be etched to a preselected depth. Further, the plurality of semiconductor die components may include a dielectric layer over a base semiconductor layer. Additionally, the periphery of the plurality of semiconductor die components may be etched to remove the dielectric layer and expose the base semiconductor layer at the periphery of the plurality of semiconductor die components.

In a sixth embodiment, the one or more of the plurality of semiconductor die components may be bonded by either a direct bonding technique without adhesive or a metal to metal diffusion bond.

In a seventh embodiment, particles and shards of material may be removed from a sidewall of the plurality of semiconductor die components, wherein the particles and shards are removed from the sidewall by etching the sidewall of the plurality of semiconductor die components.

In one embodiment, after a singulation step, particles and shards of material may be removed from a sidewall of a die by means of ultrasonic or megasonic radiation in one or more an alkaline fluids. Following the particle removal, the sidewall of the die may be further etched to remove portions of the sidewall and portions of a planar dielectric layer of the die.

Some of the disclosed processes may be illustrated using block flow diagrams, including graphical flow diagrams and/or textual flow diagrams. The order in which the disclosed processes are described is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the disclosed processes can be implemented in any suitable manufacturing or processing apparatus or system, along with any hardware, software, firmware, or a combination thereof, without departing from the scope of the subject matter described herein.

Implementations are explained in more detail below using a plurality of examples. Although various implementations and examples are discussed here and below, further implementations and examples may be possible by combining the features and elements of individual implementations and examples.

DETAILED DESCRIPTION

Overview

Various embodiments and techniques can be used to process singulated dies in preparation for bonding. The embodiments comprise techniques to remedy the accumulation of particles found on dies, including particles created during the singulation of the dies, and includes removing, dissolving or etching shards at the edges of dies to provide a smooth bonding surface.

FIG. 1(A) is a profile view showing defects on a top surface of a die, according to an embodiment. As shown, a first die 102 is shown without any defects. In contrast, a second die 104 is shown with defects 106. Of course, it is to be appreciated that defects 106 may occur on any surface, sidewall, and/or edge of the first die 102 and/or second die 104.

The first die 102 and/or the second die 104 may be singulated from and/or removed from wafers, such as GaAs, diamond coated substrates, silicon carbide, silicon oxide, Silicon Nitride, silicon wafers, Lithium Niobate, Lithium Tantalate, flat panels, glasses, ceramics, circuit boards, packages, an interposer, structures with or without an embedded metallic layer, conductive interconnects 108, device or devices, etc. In one embodiment, defects 106 may include particles and/or shards and may result from die cutting, dicing, and/or singulating the first die 102 and/or the second die 104. For example, mechanical cutting (i.e. sawing) of the first die 102 and/or the second die 104 may cause defects such as particles 106, particularly at the edges and/or sidewalls. Additionally, when the first die 102 and/or the second die 104 is cut (even using a laser), the first die 102 and/or the second die 104 may crack and/or generate particles 106 (such as silicon oxide particles). Further, after polishing the first die 102 and/or the second die 104, shards of particles 106 may still be present on the edges and/or sidewalls of the first die 102 and/or the second die 104.

Figure 1B:
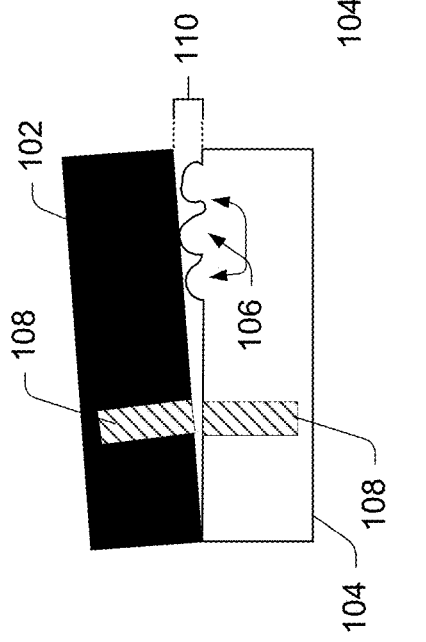
FIG. 1(B) is a profile view showing a section of bonded dies with defects.

FIG. 1(B) is a profile view showing a section of bonded dies with defects such as particles 106. As shown, with defects 106 present at a portion of the bonding surface of the second die 104, the first die 102 cannot be fully bonded to the second die 104. This is shown by the gap 110 (or void) found between the first die 102 and the second die 104. This gap 110 may be intolerable if the integrity of the bond is compromised, or if the gap 110 is large enough to negatively impact the electrical conductivity of mating electrical interconnects 108 if present at the bonding surfaces of the dies 102 and 104. As discussed above, although the defects 106 may be found on the bonding surface of the second die 104, additional or other defects (such as particles) may be found along another surface and/or sidewall of the first die 102 and/or the second die 104.

Figure 1C:
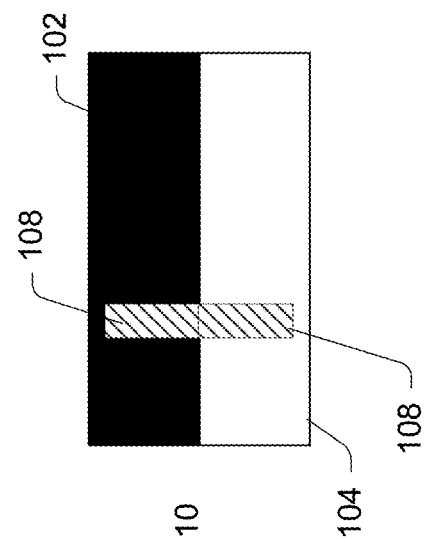
FIG. 1(C) is a profile view showing a section of bonded dies without defects.

FIG. 1(C) is a profile view showing a section of intimately bonded dies without defects. As shown, the first die 102 is fully and completely bonded to the second die 104. Any conductive interconnects 108 at the surfaces of the dies 102 and 104 are bonded as well, with reliable electrical conductivity between the interconnects 108. FIG. 1(C) shows the first die 102 and the second die 104 after each has been properly prepared for bonding. For example, the edges and sidewalls of the first die 102 and/or the second die 104 may be cleaned and etched to remove particles and shards of silicon. The edges of the first die 102 and/or the second die 104 may be etched with a dry (plasma) etch and/or wet (chemical) etch while the first die 102 and/or the second die 104 are still on a carrier (e.g., a dicing sheet or tape, grip ring, etc.) after singulation. A protective coating may be applied to the bonding surface of the first die 102 and/or the second die 104 to protect the surface during the singulation and etching. In one example, the surface and sidewalls of the first die 102 and/or the second die 104 may be etched, while, in another example, the etching may be limited to the sidewalls of the first die 102 and/or the second die 104. It is noted that the interconnects 108 are shown simplistically and not to scale. For example, the interconnects 108 may comprise one or more layers that together form the interconnect 108. Moreover, the interconnects 108 may extend partially or completely through either or both dies 102 and 104 or may even be provided only at or along the surface(s) of the dies 102 and 104 as a pattern of traces interconnecting devices within the die(s) 102 and 104.

Example Embodiments

Figure 2:
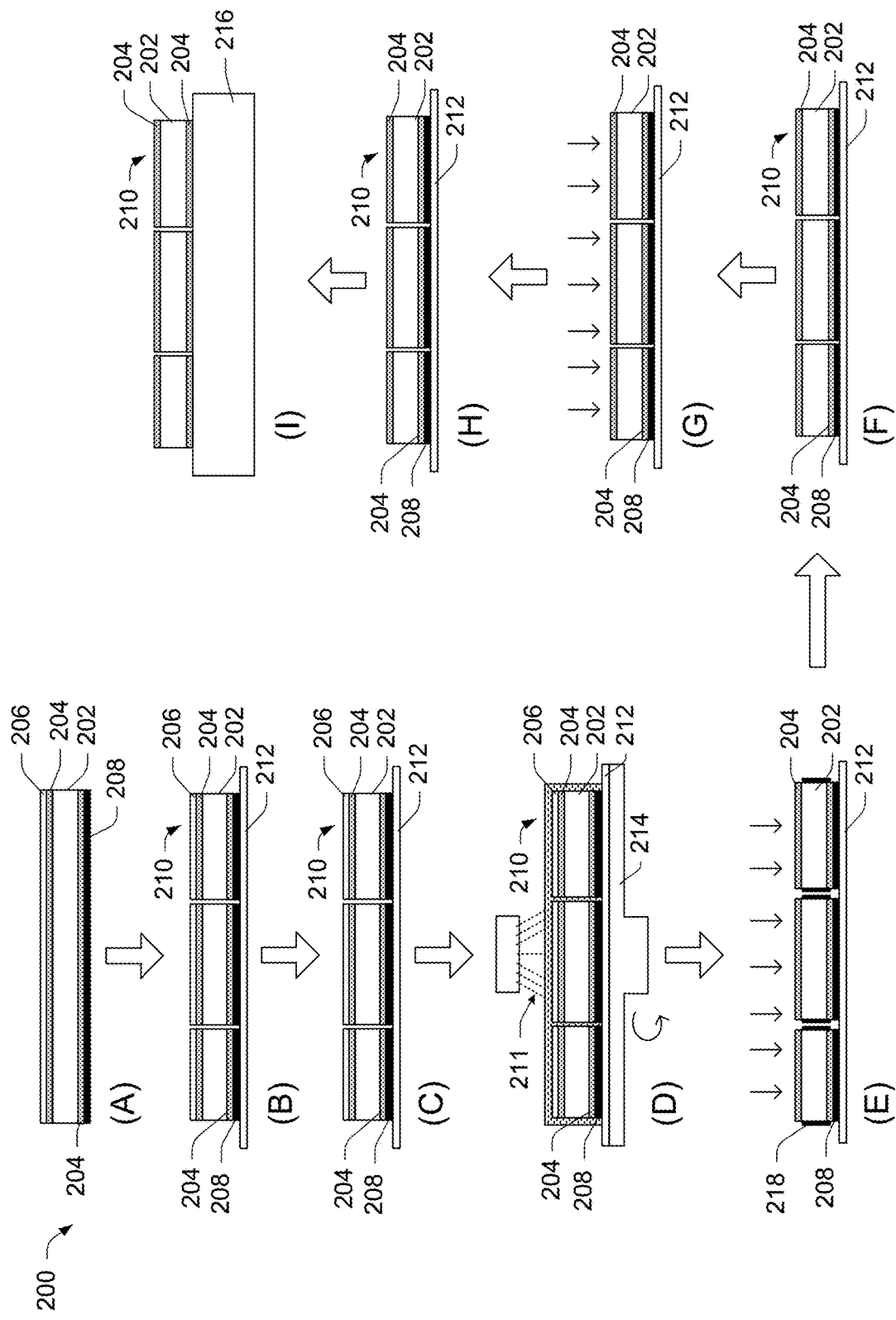
FIG. 2 is a graphical flow diagram illustrating an example process of processing stacked dies, according to an embodiment.

FIG. 2 illustrates an example process 200 of processing stacked dies, according to an embodiment. At (A), a substrate 202 (which may be a silicon wafer, for example) may include an bonding layer 204, which may comprise an insulator or dielectric layer, such as an oxide, or a hybrid bonding layer, e.g., a combination of insulative material (such as oxide) and electrically conductive interconnect layers. This bonding layer 204 may be formed on one or both sides of the substrate 202. Layer(s) 204 may be protected by a first protective layer 206 and/or a second protective layer 208. Alternatively, the substrate 202 may be exposed and/or have any number of protective layers.

At (B), the substrate 202 may be singulated on a carrier 212, into a plurality of singulated dies 210. In one embodiment, the carrier 212 may include a processing sheet, a dicing sheet or tape, grip ring, etc. Additionally, the substrate 202 may be singulated using saw dicing, wet etch or dry etch or laser methods or combinations of thereof. In one embodiment, the singulated dies 210 may have a substantially planar surface.

At (C), the singulated dies 210 may be exposed to ultra-violet light (UV) (for example, to cure the adhesive layer on the tape used as a carrier 212 for the substrate 202, to reduce the adhesion between the die 210 surface contacting the tape, or the like). Additionally, in one embodiment, the carrier 212 may be stretched while the singulated dies 210 are on the carrier 212, in preparation for cleaning and further processing the singulated dies 210. Further processing can include reducing the thickness of the singulated dies 210, for example.

At (D), the singulated dies 210 may be cleaned and the sidewalls of the singulated dies 210 may be etched. For example, the cleaning may remove one or more protective layers, including the protective layer 206 and/or the protective layer 208. In an embodiment, the etching may dissolve silicon oxide, silicon nitride, and/or silicon to eliminate the particles and/or shards. Chemical etchants 211, including acids, may be used to etch the periphery of the surface of the dies 210, including the bonding layer 204, and may also be used to etch the sidewalls of the singulated dies 210. In an example where the surface and/or sidewalls of the singulated dies 210 are etched (for silicon dies 210, for instance), the etchant 211 may comprise a chemical mixture of hydrofluoric acid and a suitable oxidizing agent, for example nitric acid. In some applications, a wet etchant may be comprised of a mixture of buffered hydrofluoric acid and a suitable organic acid in combination with an oxidizing agent. In other applications, a suitable metal complexing agent may be added to the etching solution to protect the metals on the die 210 bonding surface from the etchant. In one example, a metal complexing or passivating agent may be comprised of molecules with triazole moieties, for example Benzotriazole (BTA), or the like. In one embodiment, the BTA may protect copper on the surface of the singulated dies 210 from corrosion or dissolution by the etching solution.

After etching the surface (and sidewalls) of the die 210 and stripping off the protective layer 206 and/or 208, the complexing agent is cleaned off of the bonding surface of the die 210. As an alternative to a wet etch, the sidewalls of the die 210 may also be cleaned using dry etch methods, including using plasma processing similar to processes used in etching silicon. After a dry sidewall etching step, the protective layer 206 can be stripped from the bonding surface of the sidewalls of the die 210. Cleaning the protective layer 206 may also include cleaning any organic material residues resulting from the dry etching. In one embodiment, the organic residue on the side wall of the processed die 210 may be left intact. Strongly adhering side wall organic residue may minimize subsequent particles shedding from the die 210.

Additionally, cleaning and/or further processing of the singulated dies 210 may occur on a spin fixture 214 (or the like). The chemical etchant 211 is sprayed onto the diced wafer surface and forms a thin layer over the top surface of the dies 210 and fills the gaps between the dies 210. In one embodiment, etching the sidewalls of the singulated dies 210 may cause defects on the sidewalls of the dies 210 to be removed.

Optionally, in an embodiment, the sidewalls of the dies 210 may be selectively coated to coat to the sidewalls and any particles and/or shards that may be present on the sidewalls. For example, a selective coating 218 may be applied to the sidewalls, using a spin coating process, an electrocoating process, or the like. The particles and/or shards are coated to the sidewalls with the coating 218 to adhere the particles and/or shards to the sidewalls, preventing the particles and/or shards from contaminating other areas of the dies 210, including the bonding surfaces of the dies 210. In various embodiments, the coating layer 218 comprises a material such as a glass, a boron doped glass, a phosphorus doped glass, or the like, that adheres to the silicon of the sidewalls, and won't generally adhere to any other surfaces.

In various embodiments, the coating layer 218 comprises a layer that is approximately 50 nm or less, that traps the particles and shards to the sidewalls of the dies 210, and prevents their shedding off the sidewalls. The coating layer 218 may be heat cured to the dies 210 for stabilization, for a predefined duration at a predefined temperature (e.g., approximately 80 degrees C., or the like). While the coating layer 218 can be added after cleaning the dies 210 as discussed, in various embodiments, the coating layer 218 may be deposited to the sidewalls at other steps in the process 200.

At (E), the singulated dies 210 may undergo plasma processes (such as ashing, for example) to remove any residue of the protective layer 206. At (F), the singulated dies 210 may be cleaned to remove any residues or particles of debris resulting from step (E). At (G), the singulated dies 210 (including one or both of the oxide layers 204) may be plasma-activated (surface activation) to prepare the singulated dies 210 for direct bonding. At (H), the plasma-activated singulated dies 210 may be cleaned. At (I), one or more of the singulated dies 210 may be bonded to a prepared surface of a second substrate 216. In particular, a bonding layer 204 (e.g., an oxide or dielectric layer with or without conductive layers) of the singulated dies 210 may be bonded directly to the prepared surface of the second substrate 216. In one embodiment, the singulated dies 210 (via the bonding layer 204) may be bonded to the second substrate 216 using a ZIBOND® direct bonding, or DBI® hybrid bonding, technique, or the like, wherein the singulated dies 210 are directly bonded (and, in some instances, electrically connected) to portions of the surface of the second substrate 216 without the use of adhesives.

In various implementations, the substrate 216 may comprise another prepared surface of a silicon wafer, GaAs, diamond coated substrate, silicon carbide, silicon oxide, Silicon Nitride, Lithium Niobate, Lithium Tantalate, flat panel, glass, ceramic, circuit board, package, an interposer, a structure with or without an embedded device or devices, and so forth. In one embodiment, the prepared substrate 216 comprises the surface of another die 210 or another bonded die 304, as discussed further below.

Figure 3:
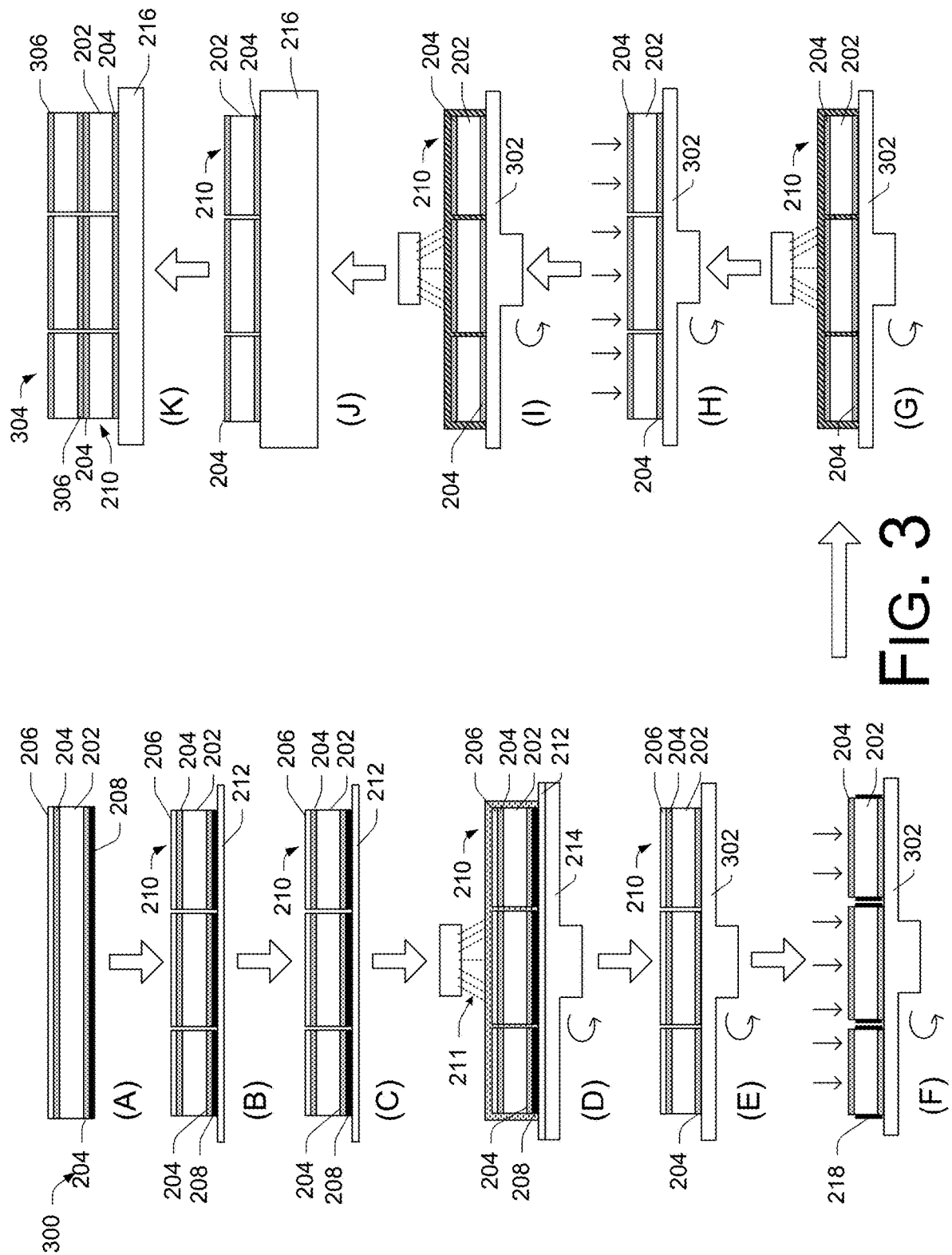
FIG. 3 is a graphical flow diagram illustrating an example process of processing stacked dies, according to another embodiment.

FIG. 3 illustrates an example process 300 of processing stacked dies, according to an embodiment. As described hereinabove, steps (A)-(D) of process 300 function in a manner consistent with steps (A)-(D) of process 200. This includes etching the surface and periphery of the dies 210 (in a same or separate process step) to remove particles and shards of silicon or oxide from the surface and periphery of the dies 210.

Optionally, in an embodiment, the sidewalls of the dies 210 may be selectively coated to coat to the sidewalls and any particles and/or shards that may be present on the sidewalls, as described above. For example, a selective coating 218 may be applied to the sidewalls, using a spin coating process, an electrocoating process, or the like. The particles and/or shards are coated to the sidewalls with the coating 218 to adhere the particles and/or shards to the sidewalls, preventing the particles and/or shards from contaminating other areas of the dies 210, including the bonding surfaces of the dies 210. In various embodiments, the coating layer 218 comprises a material such as a glass, a boron doped glass, a phosphorus doped glass, or the like, that adheres to the silicon of the sidewalls, and won't generally adhere to any other surfaces.

In various embodiments, the coating layer 218 comprises a layer that is approximately 50 nm or less, that traps the particles and shards to the sidewalls of the dies 210, and prevents their shedding off the sidewalls. The coating layer 218 may be heat cured to the dies 210 for stabilization, for a predefined duration at a predefined temperature (e.g., approximately 80 degrees C., or the like). While the coating layer 218 can be added after cleaning the dies 210 as discussed, in various embodiments, the coating layer 218 may be deposited to the sidewalls at other steps in the process 300.

With continuing reference to process 300, at (E), the singulated dies 210 may be transferred to a spin fixture 214 (or the like) and processed/cleaned while on a single carrier, such as the spin plate 214 or the like, for all of the described process steps (including singulation, in some embodiments). Alternately, the singulated dies 210 can be transferred between different carriers (such as spin plate 302) for one or more processes at each station. At (F), the singulated dies 210 may undergo plasma treatment to remove any residue of the protective layer 206 (in a similar manner to step (E) of process 200) while still on the spin plate 302.

At (G), the singulated dies 210 may be cleaned to remove the residue resulting from the plasma process at (F). At (H), the singulated dies 210 may be plasma-activated (surface activation) to prepare the singulated dies 210 (including the bonding layer(s) 204) for direct bonding. At (I), the plasma-activated singulated dies 210 may be cleaned.

At (J), one or more of the singulated dies 210 may be bonded to the prepared surface of a second substrate 216. In particular, a bonding layer 204 (e.g., an oxide or dielectric layer with or without conductive layers) may be bonded to the prepared surface of the second substrate 216. In one embodiment, the singulated dies 210 (via the oxide layer 204) may be directly bonded to the second substrate 216 using a ZIBOND® direct bonding, or DBI® hybrid bonding, technique, or the like (e.g., without adhesive or an intervening layer).

At (K), one or more additional singulated dies 304, prepared similarly to the singulated dies 210 (e.g., the dies 304 may also be singulated from the substrate 202), may be bonded to the exposed second surface of one or more of the singulated dies 210, forming one or more die stacks. In particular, a bonding layer 306 (e.g., an oxide or dielectric layer with or without conductive layers) of the singulated dies 304 may be directly bonded to the second surface of the singulated dies 210, which has also been prepared for bonding. Preparation for bonding can include one or more cleaning, surface planarizing, and plasma treating process steps as desired. Additionally, the second surface (including the periphery) of the dies 210 may also be etched to remove undesirable particles and shards, etc.

Additional singulated dies 304 may be added in like manner to form die stacks with a desired quantity of die layers. In some embodiments, the singulated dies 210 and the second substrate 216 may be thermally treated after bonding, with additional thermal treatment after each layer of the singulated dies 304 is added. Alternately, the singulated dies 210, the singulated dies 304, and the second substrate 216 are thermally treated once several or all layers of the stacked dies (210, 304) are in place and bonded.

Figure 4:
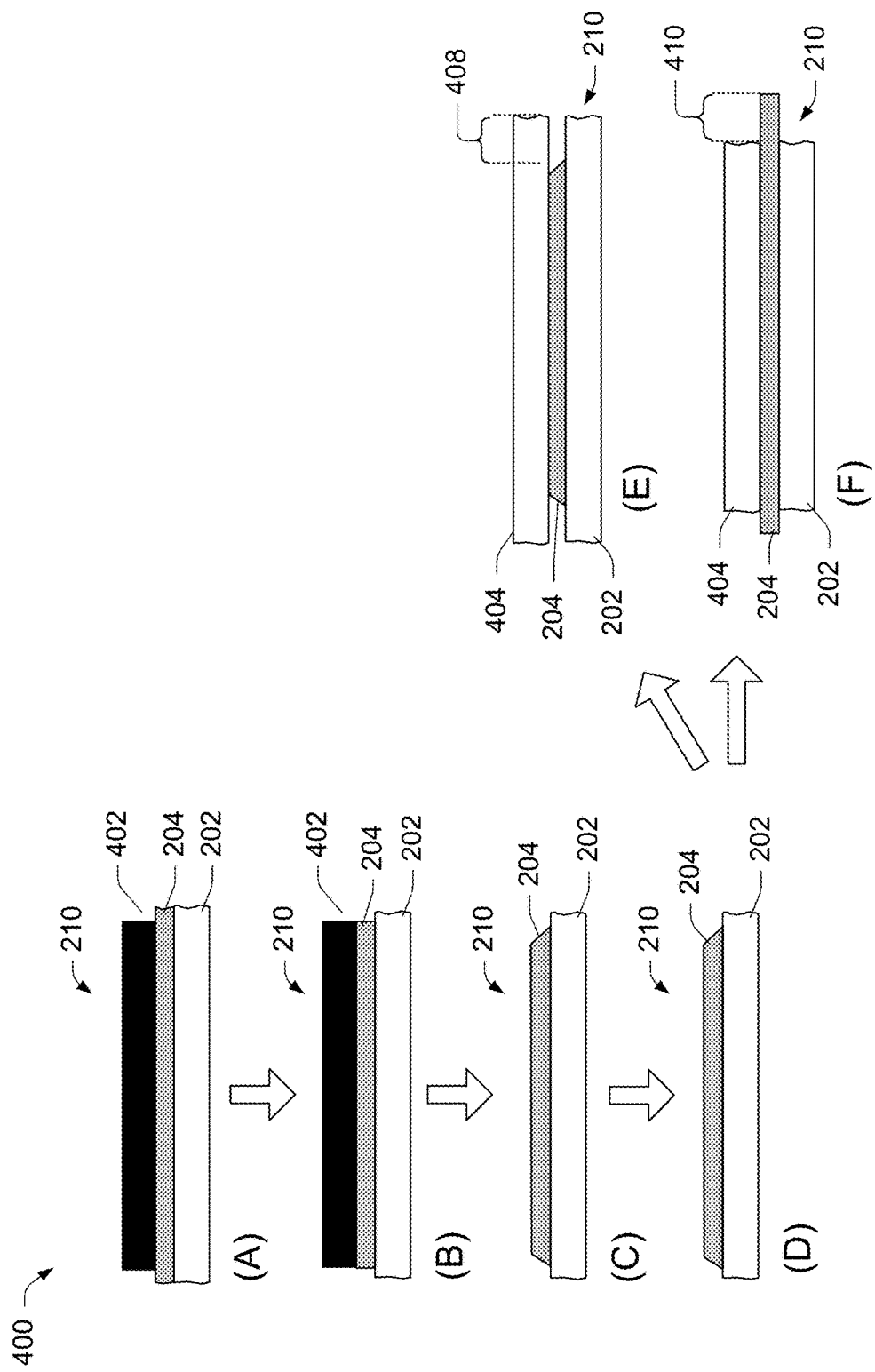
FIG. 4 is a graphical flow diagram illustrating an example process of processing stacked dies, according to a further embodiment.

FIG. 4 illustrates another example process 400 of processing stacked dies, according to an embodiment. At (A), a resist layer 402 is coated on the singulated dies 210, which include a bonding layer 204 (e.g., an insulating or dielectric layer with or without conductive layers or structures) and a substrate region 202 (e.g., silicon). In an implementation, the resist layer 402 may be patterned, for example to expose the periphery of the singulated dies 210 while protecting the rest of the surface of the singulated dies 210. In various embodiments, the singulated dies 210 may be singulated using dicing and/or scribing.

At (B), the exposed edges and sidewalls of the singulated dies 210 may be cleaned and etched, resulting in an undercut or recess at the periphery of the singulated dies 210. For example, the rough-cut edges of the singulated dies 210 may be smoothed by the etching. Additionally, the periphery of the singulated dies 210 may be recessed to have a reduced overall thickness of the singulated dies 210 at the periphery, creating a space at the edges of the singulated dies 210. For instance, the singulated dies 210 with the bonding layer 204 (e.g., dielectric, oxide, etc.) on the substrate 202 (e.g. silicon) may be etched to remove some of the oxide of the bonding layer 204 at the periphery of the singulated dies 210, and in some cases, part of the silicon of the substrate 202 as well. The etching causes the dielectric oxide of the bonding layer 204 to recess back from the edge of the singulated dies 210, exposing the silicon of the substrate 202 below in the recess. In one embodiment, the space formed by the recess may allow for some tolerance to the bonding surfaces during direct bonding, to improve the reliability of the direct bonding technique and to remove stress from the bond.

In one embodiment, the singulated dies 210 may be processed at a raised temperature (e.g., 120 degrees C.) such that the resist layer 402 disposed on the oxide layer 204 flows and pulls back from the edges of the singulated dies 210. When the edges of the singulated dies 210 are etched, the exposed portion of the oxide layer 204 may be removed. Additionally, some of the silicon of the substrate 202 may additionally be removed, depending on the duration and the formulary used for the etching. For example, the longer the duration, the greater the amount of substrate 202 may be removed. In some cases, the dielectric oxide layer 204 may have a sloped profile as a result of the etching of the singulated dies 210. This sloped profile may extend into the substrate 202 (e.g. silicon), if the etching is performed to a depth of the substrate 202.

In some embodiments, the process of etching back the dielectric layer 204 may be performed using a lithographic method in combination with dry etching wet etching or both as needed. For example, the surface of the die 210 may be patterned, and unwanted portions of the dielectric layer 204 removed by dry etching methods, and any unwanted exposed conductive features removed by wet etch methods, for instance. In other applications, it may be preferable to remove unwanted dielectric and conductive portions in one operation. In one example, a wet etchant containing halide ions, for example, buffered hydrofluoric acid and formularies containing hydrogen peroxide or nitric acid (or the like) that can oxidize the conductive features, may be applied to the surface of the dies 210 to remove the unwanted dielectric and conductive features. After the removal of the unwanted dielectric and conductive features, a protective layer may be applied for singulation operations.

At (C), the resist layer 402 may be removed from the surface of the singulated dies 210. Additionally, at (D), the singulated dies 210 may be cleaned.

At (E) and (F), the singulated dies 210 may be bonded to a second substrate 404 (such as another die 210 or 304, the second substrate 216, or the like) that has been prepared for bonding as discussed above. In one embodiment, the singulated dies 210 may be bonded to a prepared surface of the substrate 404 using a ZIBOND® or hybrid DBI® technique, or the like (e.g., without adhesive or an intervening layer). In the illustration of FIG. 4 at (E) and (F), only the die 210 is shown with an oxide layer 204. However, in some embodiments, both of the components to be bonded (e.g., the die 210, die 304, or the substrate 216) may include an oxide region (such as oxide layer 204, for example) at the bonding surface. In other words, the components are bonded at respective oxide regions. In some applications, the dielectric or oxide layer 204 of the die 210 and the prepared surface of the substrate 202 may include conductive features (not shown). The dielectric portions of the prepared surface of the die 210 and the substrate 202 can be bonded initially at lower temperatures. Any conductive features can be joined at higher temperatures between 150 to 350° C. In other applications, the dielectric portion and conductive feature bonding are formed at the same temperature.

In an implementation shown at (E), as a result of the etching of step (D), the edges of the oxide layer 204 of the singulated dies 210 may include an undercut 408. In the implementation, the singulated dies 210 may include an undercut 408 at a periphery of the singulated dies 210, such that an area of the oxide layer 204 is less than an area of a footprint of the substrate 202 and/or the substrate 404. Additionally, or alternately, in an implementation shown at (F), as a result of the etching of step (D), the edges of the substrate 202 and the substrate 404 may include an undercut 410. In this implementation, the singulated dies 210 may include an undercut 410 at a periphery of the singulated dies 210, such that an area of the oxide layer 204 is greater than an area of a footprint of the substrate 202 and/or the substrate 404. In the implementations, substrate 202 and substrate 404 may correspond with a first and second bonded microelectronic components, respectively.

According to various embodiments, edge or sidewall etching techniques described herein may provide a reduction of the complexity and cost of direct bond processes for high volume manufacturing of the singulated dies 210. Additionally, removal of dicing particles and shards from a periphery and/or edges of the singulated dies 210 may reduce process-related defects in wafer-to-wafer, die-to-wafer, die-to-die, and die-to-system packaging. Further, stress may be reduced in packaged singulated dies 210 stacked in three-dimensional arrangements by rounding the edges of the stacked singulated dies 210. The techniques described herein may also result in fewer die processing steps, higher manufacturing through-put, and improved profit margin for ZiBond® and direct bond interconnect (DBI®) manufactured devices. Other advantages of the disclosed techniques will also be apparent to those having skill in the art.

FIG. 5(A) is a profile view of a portion of an example die 210 with a recessed bonding layer 204 (e.g., insulating or dielectric layer with or without conductive layers), according to an embodiment. Additionally, FIG. 5(B) is a magnified view of the profile view of the die 210 with a recessed bonding layer 204 (e.g., oxide region). As shown, the die 210 may include the bonding layer 204 that is recessed back from the substrate 202. The profile view of FIG. 5(B) may correspond with the profile view shown in step (D) of FIG. 4, for example. Additionally, FIG. 5(B) includes a recess on one side of the bonding layer 204, however, as shown in step (D) of FIG. 4 and at FIG. 5(C), the recess may be also located on both (or other) sides of the bonding layer 204.

In particular, the sloped profile 502 of the oxide layer 204 may extend into the substrate 202 due to etching (for example, as described with reference to step (D) of FIG. 4). Additionally, the sloped profile 502 may provide clearance at the perimeter of the substrate 202 such that a close and intimate bond may be achieved between, for example, the singulated dies 210 and a prepared surface of the second substrate 216 (or the like), even in the presence of any particles at the perimeter of the substrate 202.

For instance this is illustrated in FIG. 5(C), wherein an example die 210 is shown bonded to another example die 210', forming an example die stack or example microelectronic assembly 500 (or the like). As shown in the illustration of FIG. 5(C), the bonding layer 204, which includes an insulating or dielectric material such as oxide and may also include one or more conductive layers or structures 504, is directly bonded to the bonding layer 204', which also includes an insulating or dielectric material such as oxide and may also include one or more conductive layers or structures 504'. Conductive features 504 and 504' may extend only into respective bonding layers 204 and 204' or may extend partially or entirely through dies 210 and 210'. The recess at the bonding layer 204 and the recess at the bonding layer 204' (if present) may form a gap 506 at the periphery of the assembly 500, where the die 210 is bonded to the die 210'. In various embodiments, the gap 506 may be of such size that any particles 508 remaining in the gap 506 may not hinder the formation of a close and intimate bond between the bonding surfaces 204 and 204', including close and electrically conductive reliable bonds between conductive structures 504 and 504'. In various embodiments, the gap 506 may be filled as desired, for instance with an encapsulant, a dielectric material, an underfill material, or the like. In other embodiments, the gap 506 may remain unfilled, or may be filled with other inert or active materials as desired. Similar profiles as shown in FIGS. 5(A) and 5(B) may be created on the backsides of dies 210 and 210' and more than two dies may be stacked together.

FIG. 6 is a flow diagram 600 illustrating example processes for processing stacked dies, according to an embodiment. At 602, the process includes singulating a plurality of semiconductor die components (such as the singulated dies 210 or the singulated dies 304, for example) from a wafer component (such as the substrate 202, for example). In an embodiment, each of the semiconductor die components has a substantially planar surface. In another embodiment, the process includes depositing a protective coating (such as the protective coating 206, for example) over the substantially planar surface of the semiconductor die components (either before or after singulation).

In one embodiment, the process includes heating the plurality of semiconductor die components, after singulating, to cause the protective coating (such as the protective coating 206) to recede from a periphery of the plurality of semiconductor die components. Additionally, the periphery of the plurality of semiconductor die components and/or the substantially planar surface of the plurality of semiconductor die components may be etched to a preselected depth.

Alternatively, the plurality of semiconductor die components may include a dielectric layer over a base semiconductor layer. Additionally, the dielectric layer may have a substantially planar surface and as described above, the dielectric layer may include one or more conductive features. In one embodiment, the process includes etching the periphery of the plurality of semiconductor die components such that at least a portion of the dielectric layer is removed and the base semiconductor layer at the periphery of the plurality of semiconductor die components is exposed.

At 604, the process includes removing the particles and shards of material from the edges the plurality of semiconductor die components. Alternatively, the particles and shards may be removed from the sidewalls of the plurality of semiconductor die components. In one embodiment, the particles and shards may be removed by etching the edges and/or sidewalls of the plurality of semiconductor die components. Optionally, the etching of the edges and/or sidewalls occurs while the plurality of semiconductor die components are on a dicing carrier. Additionally, the etching may use plasma etch and/or a chemical etchant comprising hydrofluoric acid and nitric acid with Benzotriazole (BTA). In an alternative implementation, a protective coating (such as the protective coating 206) may be applied to the substantially planar surface of the plurality of semiconductor die components to protect the substantially planar surface from an etchant.

At 606, the process includes bonding the one or more of the plurality of semiconductor die components to a prepared bonding surface, via the substantially planar surface. For example, the bonding may occur by a direct bond using a ZIBOND® or DBI® bonding technique, or the like, without adhesive or an intervening layer. The bonding may include electrically coupling opposing conductive features at the bonding surfaces of the die(s) and the prepared bonding surface.

The disclosed processes described herein are illustrated using block flow diagrams. The order in which the disclosed processes are described is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the disclosed processes can be implemented in any suitable manufacturing or processing apparatus or system, along with any hardware, software, firmware, or a combination thereof, without departing from the scope of the subject matter described herein.

Although various implementations and examples are discussed herein, further implementations and examples may be possible by combining the features and elements of individual implementations and examples.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A microelectronic system, comprising:
a first microelectronic component comprising a first semiconductor layer and a first dielectric layer having a first substantially planar surface; and
a die comprising a second semiconductor layer and a second dielectric layer having a second substantially planar surface, wherein a portion of the second dielectric layer is recessed at a periphery of the second dielectric layer, such that an area of the second substantially planar surface of the second dielectric layer is less than an area of a cross-section of the widest portion of the die; and
wherein the second dielectric layer is directly bonded to the first dielectric layer without adhesive.

2. The microelectronic system of claim 1, wherein the second dielectric layer creates an undercut between the first microelectronic component and the die.

3. The microelectronic system of claim 2, wherein the undercut extends into the second semiconductor layer such that the second semiconductor layer is exposed at a periphery of the die.

4. The microelectronic system of claim 1, wherein the second dielectric layer includes a substantially planar oxide layer, and wherein at least a portion of the substantially planar oxide layer at one or more edges of the second dielectric layer is recessed or removed.

5. The microelectronic system of claim 1, wherein the second semiconductor layer has an undercut comprising a recess at a periphery of the second semiconductor layer corresponding to the recessed portion of the second dielectric layer.

6. The microelectronic system of claim 1, further comprising an undercut at a periphery of the first semiconductor layer, an undercut at a periphery of the second semiconductor layer, or an undercut at a periphery of the first semiconductor layer and an undercut at a periphery of the second semiconductor layer.

7. The microelectronic system of claim 1, wherein the first microelectronic component or the die comprises a direct band gap or an indirect band gap semiconductor.

8. The microelectronic system of claim 1, wherein a portion of the first dielectric layer is recessed at a periphery of the first dielectric layer, such that an area of the surface of the first dielectric layer is less than an area of a cross-section of the widest portion of the first microelectronic component.

9. The microelectronic system of claim 1, wherein the first microelectronic component comprises a wafer.

10. The microelectronic system of claim 1, wherein the second dielectric layer comprises a sloped profile.

11. The microelectronic system of claim 10, wherein the sloped profile extends into the second semiconductor layer.

12. The microelectronic system of claim 10, wherein the sloped profile extends substantially about an entire perimeter of the second dielectric layer.

13. The microelectronic system of claim 1, wherein the recessed portion of the second dielectric layer is filled with a dielectric material.

14. The microelectronic system of claim 13, wherein the dielectric material comprises silicon oxide.

15. The microelectronic system of claim 1, wherein the recessed portion of the second dielectric layer is filled with an encapsulant.

16. The microelectronic system of claim 1, wherein the die consists of the second semiconductor layer and the second dielectric layer.

17. A microelectronic system, comprising:
a first die component comprising a first dielectric layer over a first base semiconductor layer, the first dielectric layer having a substantially planar surface;
a second microelectronic component comprising a second dielectric layer and a second base semiconductor layer,
wherein the second dielectric layer is directly bonded without an adhesive to the first dielectric layer; and
wherein a periphery of the first die component and a periphery of the second base semiconductor layer are recessed such that an area of the footprint of the first die component and an area of a footprint of the second base semiconductor layer are both less than at least one of an area of the first dielectric layer or an area of the second dielectric layer.

18. The microelectronic system of claim 17, wherein an area of the first dielectric layer is less than an area of the first base semiconductor layer.

19. The microelectronic system of claim 17, wherein at least a portion of the first dielectric layer is recessed at the periphery of the first die component.

20. The microelectronic system of claim 17, wherein at least a portion of the first base semiconductor layer is recessed at the periphery of the first die component.

21. The microelectronic system of claim 17, wherein a periphery of the second microelectronic component is recessed at a bond interface with the first die component.

22. A microelectronic assembly comprising:
a semiconductor die comprising at least a first planar dielectric layer having a recess at a periphery of the semiconductor die; and
a microelectronic component comprising a second planar dielectric layer,
wherein the first dielectric layer is directly bonded to the second dielectric layer, and
wherein the recess comprises a sloped profile.

23. The microelectronic assembly of claim 22, wherein the microelectronic component has an undercut comprising a recess at a periphery of the microelectronic component.

24. The microelectronic assembly of claim 22, wherein the first dielectric layer comprises an oxide layer as a bonding surface with the microelectronic component, and wherein one or more edges of the oxide layer is recessed or removed and exposes a base layer beneath the oxide layer.

25. The microelectronic assembly of claim 22, wherein at least one of the semiconductor die and the microelectronic component comprises a direct band gap or an indirect band gap semiconductor.

26. The microelectronic assembly of claim 22, wherein at least one of the semiconductor die and the microelectronic component further comprises a non-semiconductor material.

27. The microelectronic assembly of claim 22, wherein the semiconductor die and microelectronic component each comprise a microelectronic die.

28. The microelectronic assembly of claim 22, wherein the second planar dielectric layer has a recess at a periphery of the microelectronic component.

29. The microelectronic assembly of claim 22, wherein the sloped profile extends into a semiconductor layer of the semiconductor die.

* * * * *